United States Patent
Andresen et al.

(10) Patent No.: US 6,535,368 B2
(45) Date of Patent: Mar. 18, 2003

(54) SHARED 5 VOLT TOLERANT ESD PROTECTION CIRCUIT FOR LOW VOLTAGE CMOS PROCESS

(75) Inventors: Bernhard H. Andresen, Dallas, TX (US); Roger A. Cline, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/929,145

(22) Filed: Aug. 14, 2001

(65) Prior Publication Data

US 2002/0027755 A1 Mar. 7, 2002

Related U.S. Application Data

(62) Division of application No. 09/325,455, filed on Jun. 3, 1999, now Pat. No. 6,353,520.

(51) Int. Cl.[7] .................................................. H02H 9/00
(52) U.S. Cl. ....................................................... 361/56
(58) Field of Search ................................ 257/133, 173, 257/357, 362; 361/56, 111, 91.1

(56) References Cited

U.S. PATENT DOCUMENTS

| | | | |
|---|---|---|---|
| 5,637,892 A | 6/1997 | Leach | 257/362 |
| 5,708,549 A | * 1/1998 | Croft | 361/111 |
| 5,978,192 A | * 11/1999 | Young et al. | 361/111 |
| 5,986,861 A | * 11/1999 | Pontarollo | 361/56 |
| 6,046,897 A | 4/2000 | Smith et al. | 361/56 |
| 6,078,083 A | 6/2000 | Amerasekera et al. | 257/358 |
| 6,147,538 A | 11/2000 | Andresen et al. | 361/56 |

OTHER PUBLICATIONS

Amerasekera, Ajith, et al.; *ESD in Silicon Integrated Circuits*, Texas Instruments Incorporated, Dallas, Texas, USA, pp. 56–134. 1995, No month.
Ramaswamy, Sridhar, et al.; *EOS/ESD Reliability of Deep Sub–Micron NMOS Protection Devices*, 1995 IEEE, pp. 284–291. No month.
Duvvury, Charvaka, et al.; *ESD: A Pervasive Reliability Concern for IC Technologies*, Proc. Of the IEEE, vol. 81, No. 5, May 1993, pp. 690–702.

* cited by examiner

Primary Examiner—Ronald W. Leja
(74) Attorney, Agent, or Firm—Gerald E. Laws; W. James Brady, III; Frederick J. Telecky, Jr.

(57) ABSTRACT

An integrated circuit is provided with a local electrostatic discharge (ESD) protection circuitry (120) associated with each signal pad. The integrated circuit has internal circuitry (100) that operates at a low supply voltage, but at least some of the interface signals impressed on the signal pads operate at a high supply voltage. The local ESD protection circuitry associated with each signal pad comprises only a pair of diodes connected respectively to the ground reference bus and a high voltage supply bus. A few shared clamp circuits (222) are connected to the voltage buses and clamp any ESD voltage surge that is transferred to the high voltage bus by the individual signal pad ESD protection circuits. The clamp circuits use cascoded low voltage MOS devices (P1, N1, P2) that are biased during normal operation so that electrical over-stress does not occur.

15 Claims, 5 Drawing Sheets

SHARED 5 VOLT TOLERANT ESD PROTECTION CIRCUIT FOR LOW VOLTAGE CMOS PROCESS

This is a Divisional Application of U.S. patent Ser. No. 09/325,455, filed Jun. 03, 1999 now U.S. Pat. No. 6,353,520.

FIELD OF THE INVENTION

The present invention relates to Electrical Over-Stress (EOS) and Electrostatic Discharge (ESD) protection in high density integrated circuits.

BACKGROUND OF THE INVENTION

Modern integrated circuits are easily damaged by excess voltages, and one common source of such potentially damaging voltages is caused when two materials are rubbed together. A person can develop very high static voltage, from a few hundred to several thousand volts, simply by walking across a room or by removing an IC from its plastic package, even when careful handling procedures are followed. The impact of ESD damage due to handling and testing can have a significant influence on product yield. Large ICs manufactured in advanced processes may only have 30 to 40 chips per six inch wafer. Any product loss due to ESD damage has a direct impact on profitability and even fall-outs of the order of 1% are not acceptable. Another issue which gives increasing importance to ESD control is the move towards replaceable ICs in electronic systems. Instead of replacing the whole circuit board, as used to be the standard practice, users are now encouraged to purchase upgrades to their microprocessors and memory cards and perform the installation themselves. Since the installation does not necessarily take place in an ESD-safe environment, the ICs need to be ESD robust.

The major source of ESD exposure to ICs is from the human body, and is known as the Human Body Model (HBM) ESD source. A charge of about 0.6 C can be induced on a body capacitance of 150 pF, leading to electrostatic potentials of 4 kV or greater. Any contact by a charged human body with a grounded object, such as the pin of an IC, can result in a discharge for about 100 ns with peak currents of several amperes to the IC.

A second source of ESD is from metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source.

A third ESD model is the charged device model (CDM). Unlike the HBM ESD source and the MM ESD source, the CDM ESD source includes situations where the IC itself becomes charged and discharges to ground. Thus, the ESD discharge current flows in the opposite direction in the IC than that of the HBM ESD source and the MM ESD source. CDM pulses also have very fast rise times compared to the HBM ESD source.

A longstanding problem is that if such a high voltage is accidentally applied to the pins of an IC package, the discharge can cause gate oxide breakdown of the devices to which it is applied. The breakdown may cause immediate destruction of the device, or it may weaken the oxide enough such that failure may occur early in the operating life of the device and thereby cause later device failure in the field.

In MOS integrated circuits, the inputs are normally connected to drive the gate of one or more MOS transistors. The term "MOS" is used in this application, as is now conventional, to refer to any insulated-gate-field-effect-transistor, or to integrated circuits which include such transistors. Furthermore, all pins are provided with protective circuits to prevent voltages from damaging the MOS gates. These protective circuits, normally placed between the input and output pads on a chip and the transistor gates to which the pads are connected, are designed to begin conducting, or to undergo breakdown, thereby providing an electrical path to ground (or to the power-supply rail) when excess voltage occurs. Such protection devices are designed to avalanche (passing a large amount of current, and dissipating the energy of the incoming transient) before the voltage on the input pin can reach levels which would damage the gate oxide. Since the breakdown mechanism is designed to be nondestructive, the protective circuits provide a normally open path that closes only when the high voltage appears at the input or output terminals, harmlessly discharging the node to which it is connected.

However, technological advances are leading to the creation of smaller and faster components that are increasingly more fragile. The output stages of MOS circuits which, until now, have been capable of withstanding high discharge currents, are becoming more vulnerable. In particular, the advantages of the various techniques for improving the performance characteristics of integrated circuits are offset by increased sensitivity to over-voltages or discharges. Breakdown voltages of the junctions or punch-through voltages between drain and source of the MOS transistors are becoming lower and the gate oxide is more fragile.

ESD protection for MOS output buffers has typically relied on a parasitic lateral bipolar transistor of the MOS devices. When the voltage reaches the breakdown voltage of the devices, the lateral transistors should turn on and clamp the pad voltage at a sufficiently low voltage to protect the output buffer. The devices typically have a snap-back characteristic during breakdown. The transistor triggers at a high voltage and snaps-back to a lower voltage to clamp the pad voltage. However, a portion of the MOS device can trigger and snap-back to a lower voltage and conduct all of the current. When this happens, this part can be destroyed before the voltage rises high enough to trigger the rest of the device. This is especially a problem for devices with low resistance substrates, since the substrate is the base of the parasitic lateral transistors and the base is difficult to forward bias if it is low resistance. Low resistance substrates are desirably used on CMOS circuits to prevent latchup of parasitic SCRs in normal operation, however, this conflicts with the use of SCRs for ESD protection.

As integrated circuits (ICs) become more complicated and, as a result, denser, the metal-oxide-semiconductor (MOS) circuit elements that make up the IC must become smaller. As the size of a MOS circuit element shrinks, its operating voltage also tends to drop. In the past, the standard operating voltage of MOS circuit elements was 5V. Newer designs are using operating voltages in the 2.5 to 3.3 volt range. For compatibility, it is desirable for the newer designs to be able to withstand 5V signals. Unfortunately, technologies developed for 3V operation have thin gate oxides, on the order of 100 angstroms. If a thin oxide device designed for 3V operation were instead operated at 5V, the device would have accelerated wear-out due to reduced gate oxide reliability.

ESD protection circuits using MOS circuit elements must be designed to avoid having the oxides stressed by a 5V bond pad voltage during normal operation. At the same time, the protection circuit must turn-on and provide good ESD protection during ESD stress. One prior art solution uses two gate oxide thicknesses. A thinner oxide is used for the internal functional circuitry and a thicker oxide is used for circuitry connected directly to a bond pad. Unfortunately, this adds process complexity by requiring two gate oxide formations. Thus, there is a need for ESD protection circuitry that will not be stressed during 5V operation and that minimizes process complexity.

Because of the importance of ESD protection, it is desirable to improve and provide alternative ESD protection circuits.

Other objects and advantages will be apparent to those of ordinary skill in the art having reference to the following figures and specification.

SUMMARY OF THE INVENTION

In general, and in an embodiment of the present invention, an integrated circuit is provided with ESD protection circuitry having shared clamp circuits. The integrated circuit has a semiconductor substrate connected to a bond pad for a reference supply voltage. There is a first bus for a first supply voltage, and a second bus for a second supply voltage, wherein the second supply voltage is higher than the first supply voltage. Internal circuitry is connected between the first bus and semiconductor substrate comprising MOS transistors having gate oxide with a first thickness suitable for the first supply voltage but not for the second supply voltage. There is a plurality of signal bond pads for connecting to a respective plurality of external signals, wherein the external signals are operable at approximately the second supply voltage. Local ESD protection circuitry associated with each signal pad has a respective diode connected between each of the plurality of signal bond pads and the second bus. Shared ESD circuitry is connected between the second bus and the semiconductor substrate. The shared ESD circuitry has at least one parasitic bipolar transistor with an emitter connected to the second bus and a collector connected to the semiconductor substrate with a base connected to a control circuit. The control circuit is operable to turn on the parasitic bipolar transistor in response to an ESD zap applied to any of the plurality of signal bond pads and has a plurality of MOS transistors that each have gate oxide only of the first thickness.

Other embodiments of the present invention will be evident from the description and drawings.

BRIEF DESCRIPTION OF THE DRAWINGS

Other features and advantages of the present invention will become apparent by reference to the following detailed description when considered in conjunction with the accompanying drawings, in which.

Corresponding numerals and symbols in the different figures and tables refer to corresponding parts unless otherwise indicated.

DETAILED DESCRIPTION OF EMBODIMENTS OF THE INVENTION

Providing high voltage operation for low voltage CMOS input/output buffers is needed in order to allow interoperability of integrated circuits designed for 3.3 volt operation with older integrated circuits designed for 5 volt operation, for example. The term 'high voltage' is used here to describe a voltage higher than the allowable transistor gate to other terminal voltage for a given CMOS process. The term 'low voltage', by contrast, is used to refer to the usual $V_{DD}$ supply voltage applied to the integrated circuit power terminals. In an embodiment of the current invention, the predominant high voltage application is 5 volts for use with a CMOS low voltage $V_{DD}$ supply of 3.3 volts. Briefly stated, 5 volt tolerant operation means that a buffer can function with 5 volts applied to its bond pad terminal while the integrated circuit is powered with 3.3 volts. Specifications for 5 volt tolerant circuits define maximum current flow into the bond pad terminal of a buffer when driven with 5 volts. No appreciable degradation of this specification is allowed over the lifetime of the integrated circuit.

Figure 1:
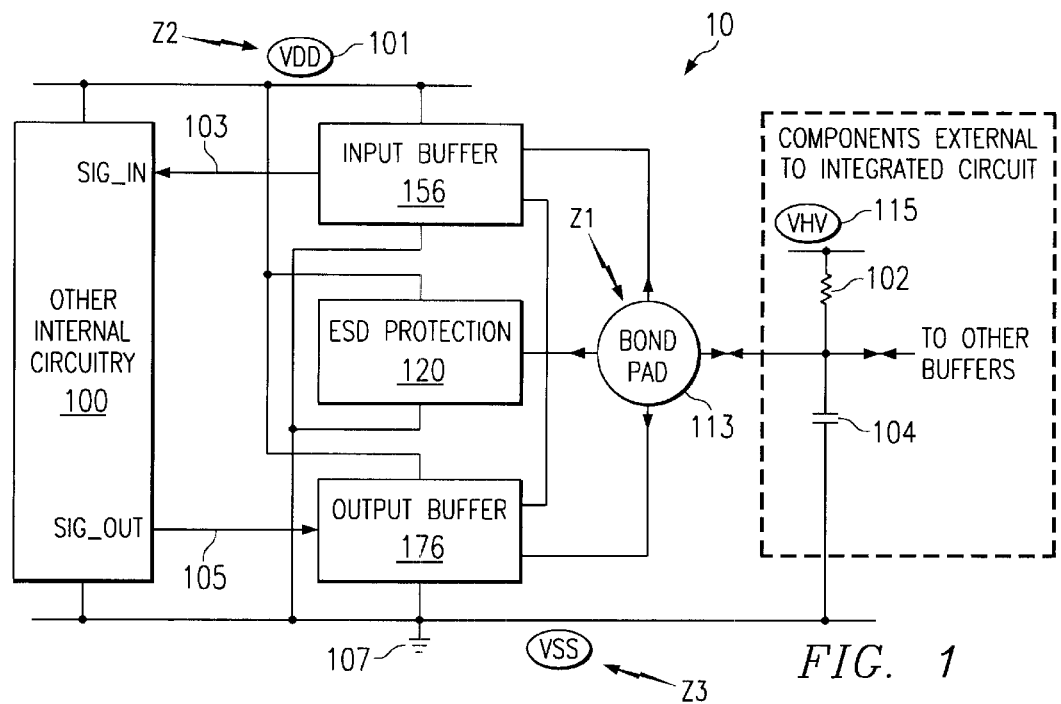
FIG. 1 is a schematic diagram of an integrated circuit with improved ESD protection, according to an aspect of the present invention.

A block diagram of an integrated circuit 10 with a high voltage tolerant buffer system is shown in FIG. 1. A single DC supply voltage of 3.3 volts is connected between positive terminal $V_{DD}$ node 101, and Vss reference terminal 107. Reference terminal 107 is typically connected to ground, or 0 volts. Components that are external to the integrated circuit are shown in the dashed box. An external voltage ranging from 0 to 5 volts is applied to the bond pad of the buffer from external high voltage supply, VHV, node 115, through external resistor 102. Note that component 102 is not necessarily a resistor but can be any device that limits the current from the 5 volt external supply to the maximum value allowed in the system specifications.

External component 104 is a capacitor representing the maximum capacitive system load that an output buffer must discharge to meet its specified timing requirements in the application. Internal signals are generated in the Other Internal Circuitry block 100 which sends logic signals to an output buffer block 176 and/or receives logic signals from an input buffer block 156.

Suitable buffers for high voltage operation are described in U.S. patent application Ser. No. 09/464,666 (TI-25514) entitled "Method of Designing Fail-Safe CMOS I/O Buffers Whose External Nodes Accept Voltages Higher than the Maximum Gate Oxide Operation Voltage" incorporated herein by reference. An open collector style output buffer would have cascode N-channel transistor in the pull-down portion of the circuit, while a tristate push-pull output circuit would have not only the cascode N-channel transistor in the pull-down portion of the circuit, but would also have a series or cascode connected P-channel transistor in the pull-up portion of the circuit. Cascode-connected transistors would be driven at their gate terminals by a bias supply circuit in order to maintain safe gate oxide voltage operating levels.

Input/output buffer bond pad 113 is driven by an output buffer block 176, and the bond pad also supplies a signal to an input buffer block 156, thereby functioning bidirectionally. Other buffers external to this integrated circuit may be present in the system. The voltage at the bond pad 113 will be at a level between 0 volts and 5 volts at any time, either due to the operation of output buffer block 176 or an output buffer external to the integrated circuit.

The Other Internal Circuitry block 100 represents the remainder of the integrated circuit components and is responsible for processing the signals to and from the input/output circuitry at this bonding pad.

The input/output buffer 156/176 and internal circuitry 100 are advantageously improved and protected from an ESD (electrostatic discharge) event Z1–Z3 to any of the bond pads or pins of the chip by the provision of ESD protection circuitry 120. Aspects of the present invention relate to protecting against zap Z1 on the signal bond pad 113. Zaps on $V_{DD}$ power pad 101 and $V_{SS}$ pad 107 are protected against by various diodes, transistors, and resistors, such as described in U.S. Pat. No. 5,637,892, entitled "Electrostatic Discharge Protection in Integrated Circuits, Systems, and Methods," and incorporated herein by reference.

An ESD event is called a "zap" herein because some ESD causes a pulse, spark or sound which the word "zap" concisely represents. ESD zaps can occur from static electricity discharges from persons installing or removing an integrated circuit chip. Also, any sudden discharge or other undesirable potential difference applied to the chip due to a surge in an industrial, office, home or field environment can be an ESD event of interest herein.

Before an ESD zap, the bond pads for $V_{DD}$ in FIG. 1 are initially at 0 volts due to substrate leakage currents. If output pad 113 is zapped positive by zap Z1 with Vss terminal 107 as reference, transistor ESD circuitry 120 is triggered and clamps the voltage on output pad 113 to a value that is less then a breakdown voltage of I/O buffers 156/176.

A key issue for ESD design is to ensure the ESD protection circuit 120 turns on with a small on-resistance so as to conduct most of the ESD current during an ESD event. A trigger element with a low trigger voltage is required for such an ESD protection scheme. In advanced submicron BiCMOS processes, a zener breakdown voltage of about a base-emitter junction of a bipolar junction transistor (BJT) is utilized for that purpose. In advanced submicron CMOS processes, this option is not available. The lowest junction breakdown voltage is known as the NMOS drain junction breakdown voltage. Therefore, the characteristics of an NMOS device in a particular process dictate the ESD protection design. In a 3.3V process, no single MOS device can be placed on the 5V power pin for ESD protection. This means a gate coupled circuit which uses a large NMOS device that goes into bipolar breakdown cannot be used unless two transistors are cascoded. This arrangement is known to be much less effective for ESD protection than a single device thereby making the size of the protection circuit prohibitively large.

Figure 2:
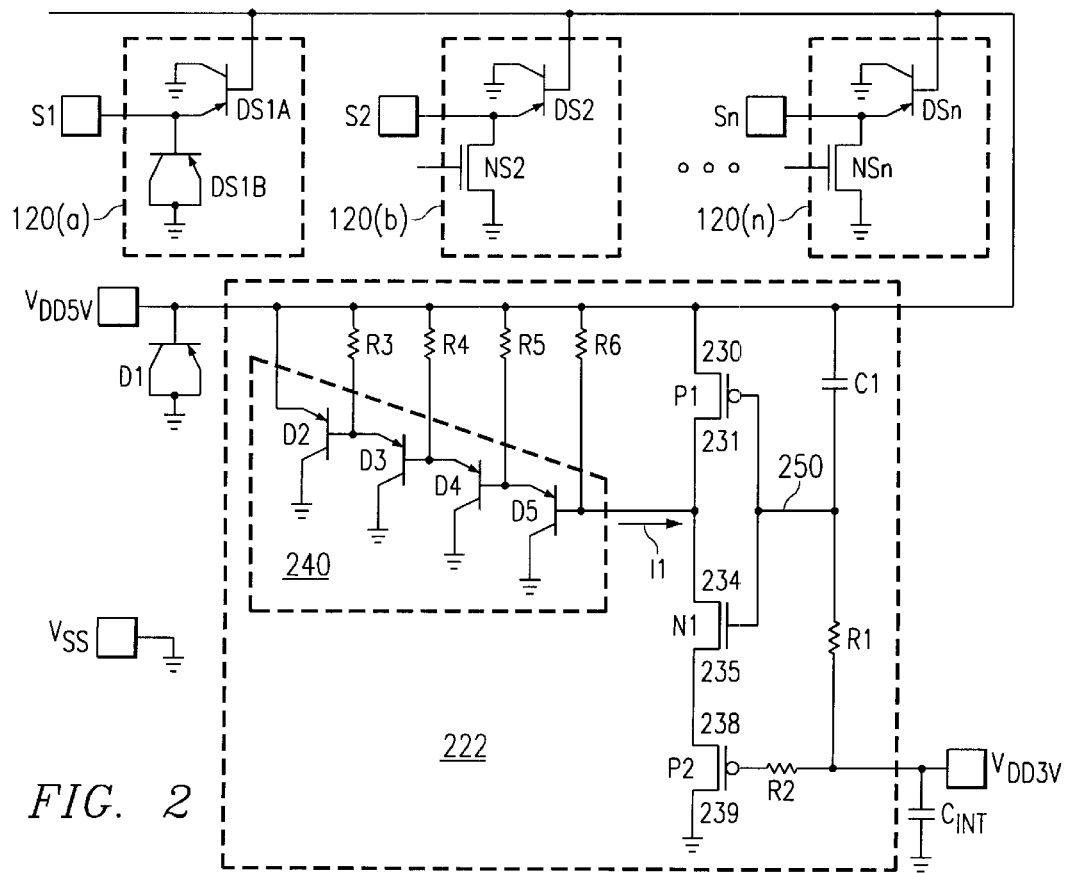
FIG. 2 is a schematic diagram of an ESD protection circuit of FIG. 1 with diodes local to each signal pad and shared clamp circuits, according to an aspect of the present invention.

FIG. 2 illustrates a novel structure that has now been discovered to overcome the 5V tolerant problem using cascode transistors. At each signal pad, a local ESD protection circuit 120 comprises only a clamp diode DS1A to $V_{DD-5V}$ and a clamp diode DS1B to Vss. Alternatively, the NMOS output transistor will suffice in place of diode DS1B, as indicated by NS2 in local ESD protection circuit 120(b). Clamp diode DS1A to $V_{DD-5V}$ has a parasitic PNP transistor with an emitter connected to signal pad S1, base connected to $V_{DD-5V}$ and collector connected to substrate. The diodes are used to divert the ESD current from the signal pin site to the $V_{DD-5V}$ and $V_{SS}$ power buses. According to an aspect of the present invention, a shared ESD clamp circuit 222 is provided for conducting ESD current from the $V_{DD-5V}$ bus to the $V_{SS}$ power bus and bond pad. Advantageously, only minimal capacitive loading is added to each signal pad by the clamp diodes. Likewise, only minimal space is required for ESD protection circuitry 120 for each signal pad.

$V_{DD-5V}$ clamp DS1A, having a parasitic PNP transistor, will also pump current into the substrate which could be used to turn on a thick field NPN structure. However, for the following discussion we assume there is only a PNP and no thick field NPN.

Still referring to FIG. 2, the operation of shared ESD protection circuit 222 will now be described in more detail. As discussed above, ESD protection for a positive ESD strike on a signal pad referenced to $V_{DD-5V}$ and a negative ESD strike on a signal pin referenced to $V_{SS}$ is obtained through forward biased diodes, such as D1.

Clamp circuit 222 has cascode connected diodes D2–D5 with associated resistors R3–R6. Each diode D2–D5 has an associated parasitic PNP transistor in which the substrate acts as a collector. Therefore, diodes D2–D5 operate as a darlington device 240. During normal operation of integrated circuit 10, shared ESD protection circuit 222 has no MOS devices which are overstressed. Every PNP base is at 5 volts ($V_{DD-5V}$) due to associated resistors R3–R6. Drain 234 of NMOS transistor N1 and drain 231/source 230 of PMOS transistor P1 are also at 5 volts. The gates of N1, P1 and P2 are all at $V_{DD-5V}$, which in this embodiment is approximately 3.3V. Therefore, NMOS transistor N1 is turned off and no current is flowing through PMOS transistor P1 or PMOS transistor P2. Source 235 of N1 and source 238 of P2 are connected and will float near their gate voltages of 3.3V.

Prior to an ESD zap, integrated circuit 10 is turned off and typically not installed in any sort of equipment. Therefore, $V_{DD-5V}$, $V_{DD-5V}$ and $V_{SS}$ are all at approximately 0 volts. $V_{DD-5V}$ has a very low capacitance to ground since only clamp diodes tie into $V_{DD-5V}$. $V_{DD-3V}$ has a large capacitance to ground, represented by $C_{INT}$, due to internal circuitry connected between $V_{DD-3V}$ and $V_{SS}$.

During an ESD zap on a signal pad that is sharing ESD circuit 222, $V_{DD-5V}$ starts at ground but rapidly increases due to the low capacitance on the $V_{DD-5V}$ bus. $V_{D-3V}$ starts at ground potential and slowly increases due to the large capacitance $C_{INT}$ to ground. A positive strike on a signal pin S1, for example, conducts $$\left(\frac{1}{1+hfe}\right)$$

of the strike current through DS1A into $V_{DD-5V}$ causing $V_{DD-5V}$ to rapidly charge up. Capacitor C1 pulls up signal 250 and thereby the gate of N1 while the gate of P2 remains at ground potential due to $V_{DD-3V}$ ground capacitance $C_{INT}$ being discharged. Therefore, PMOS device P1 is kept turned off, NMOS device N1 is turned on, and PMOS device P2 is turned on. As $V_{DD-5V}$ increases the base of PNP transistor D5 is held to $V_{GSP2}$ and $V_{DSN1}$. As a result, diode D5 conducts current I1 which flows through MOS devices N1 and P2. MOS devices N1 and P2 can handle this current because the quadruple PNP darlington 240 reduces the strike current further by $$\left(\frac{1}{1+hfe}\right)^4.$$

MOS devices N1 and P2 are relatively large to carry current I1, while PMOS device P1 can be relatively small.

R1 eventually charges capacitor C1 so that NMOS device N1 is turned off and current I1 is thereby halted. This turns off clamp circuit 222 after the ESD event dissipates. The R/C time constant of resistor R1 and Capacitor C1 is selected so that clamp circuit 222 remains turned on for the entire period of an ESD strike on any signal pad.

Figure 3:
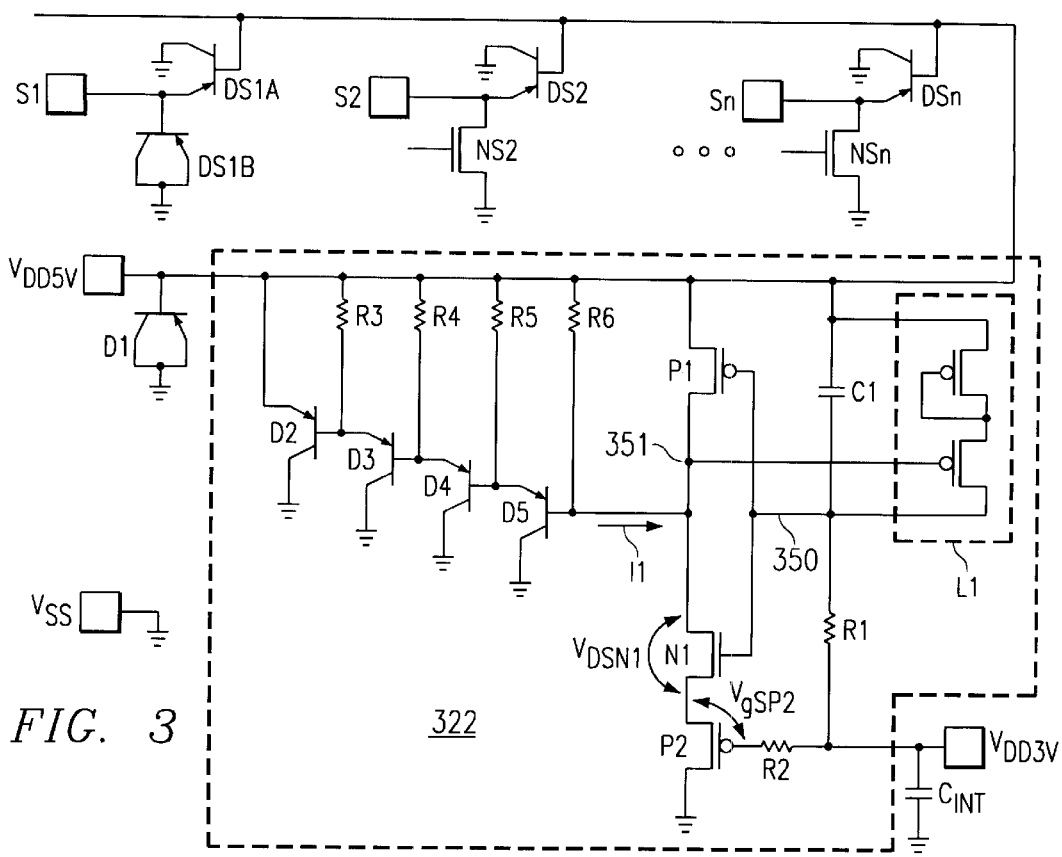
FIG. 3 is a schematic diagram of an alternative embodiment of the ESD protection circuitry of FIG. 1.

FIG. 3 is a schematic of an alternative embodiment of the present invention. Clamp circuit 322 has a latch circuit L1 associated with capacitor C1. Latch circuit L1 is operable to monitor the $V_{DD-5V}$ bus and to activate in response to a voltage that exceeds the normal 5 volt operating voltage in response to an ESD event. Latch L1 has a hysterisis circuit and remains activated until the voltage on the $V_{VDD-5V}$ bus decays to a safe value. While latch circuit L1 is activated, it provides a voltage on signal trace 350 that causes NMOS device N1 to turn on and PMOS device P1 to remain turned off. Latch circuit L1 compares the voltage at node 351 to the voltage on the power distribution bus $V_{DD-5V}$ which is clamped by the forward biased voltage drops of diodes D2–D5. As the energy of the ESD zap is expended, this voltage drop will decrease and the voltage on the $V_{DD-5V}$ bus will fall towards the voltage on node 351. At this point, latch L1 is reset and capacitor C1 is charged via resistor R1 to turn on transistor P1 and turn off clamp circuit 322. Otherwise, clamp circuit 322 operates similarly to clamp circuit 222.

Figure 4:
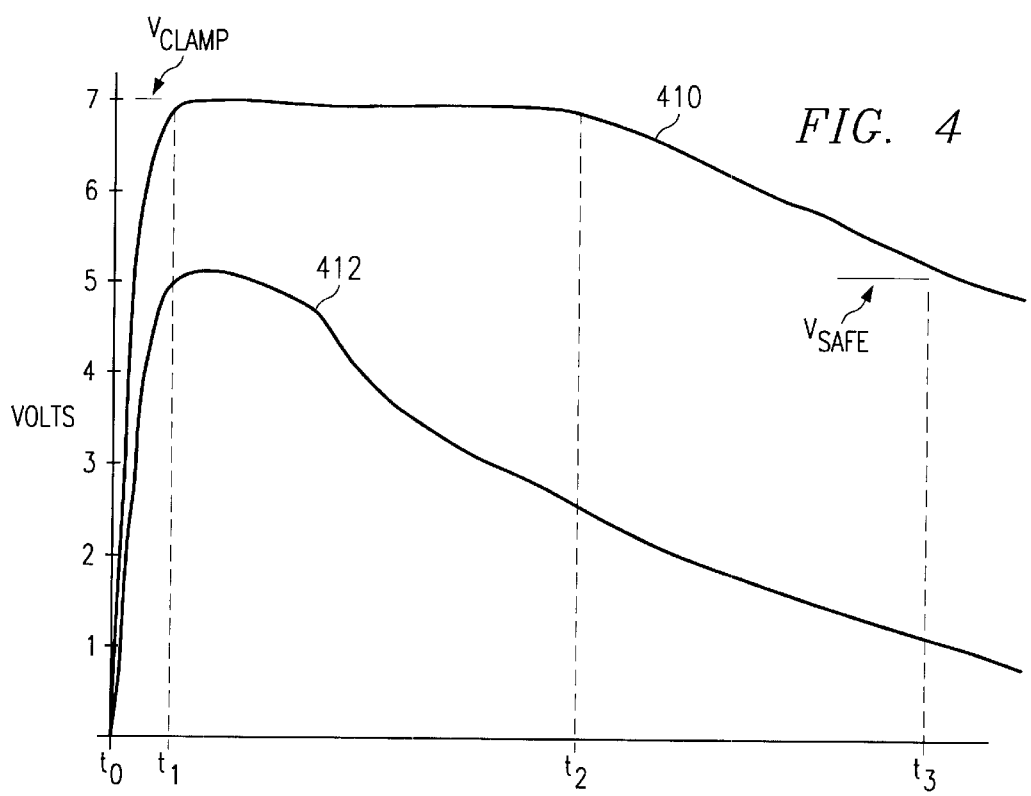
FIG. 4 illustrates operation of the ESD protection circuitry of FIGS. 2 and 3 during an ESD zap event.

FIG. 4 illustrates operation of ESD protection clamp circuitry 222 during an ESD zap event. At the onset of an ESD zap at time $t_0$, voltage on signal pad 113 starts to rapidly rise, as indicated by curve 410. Simultaneously, signal 250 connected to the gate of transistor N1 starts to rise due to zap voltage transferred by capacitor C1, as represented by curve 412. At time $t_1$, diode D5 is in full conduction mode in response to current I1. Due to the resulting high current flow of approximately 2–3 amps through darlington 240, the voltage on the $V_{DD-5V}$ bus is clamped at voltage $V_{CLAMP}$. Voltage on signal pad S1, for example, is maintained at approximately a diode drop above $V_{CLAMP}$. This voltage level is maintained until the energy of the zap is expended at time $t_2$ and then decays to nothing after time $t_3$, which is typically 150–250 ns. After time $t_1$, gate voltage on signal 250 decays due to the action of R/C circuitry R1/C1. As discussed above, the R/C time constant must be large enough to keep clamp circuit 222 activated until the voltage on the $V_{DD-5V}$ bus falls to the level indicated approximately at $V_{SAFE}$. $V_{SAFE}$ is a voltage level at which the output buffers of the integrated circuit will not be harmed due to excessive voltage.

Still referring to FIG. 4, in alternative embodiment clamp circuit 330, latch circuit L1 must remain activated until the voltage on the $V_{DD-5V}$ bus falls to the level indicated approximately at $V_{SAFE}$.

Figure 5:
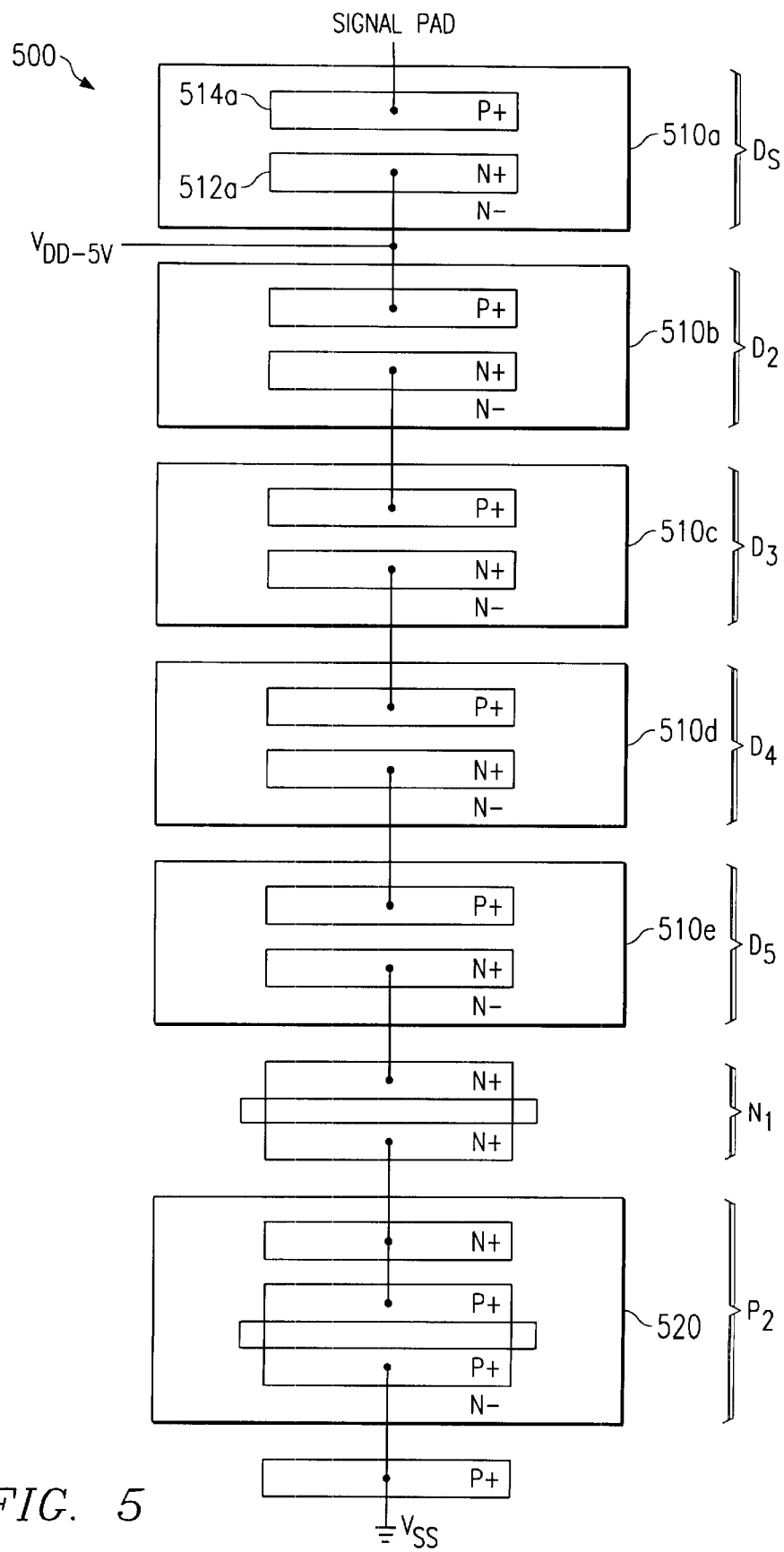
FIG. 5 is a topological diagram of one local ESD protection diode and one shared clamp circuit of the ESD protection circuitry of FIG. 2.

FIG. 5 is a topological diagram of diodes DS, D2–D5, and transistors N1, and P2. Only a portion of semiconductor substrate 500 is depicted. Remaining circuitry of integrated circuit 10 is formed on portions of semiconductor substrate 500 not shown. Substrate 500 has a p-type conductivity. Each diode is formed in an N-well, such as Nwell 510a–e. A contact region of N+ is formed in the Nwell which is the cathode region of the diode. P+ anode region 514a is also formed in Nwell 510a to produce diode DS, for example. Likewise, PMOS transistor P1 is formed in Nwell 520. NMOS transistor is formed directly in substrate 500.

Figure 6:
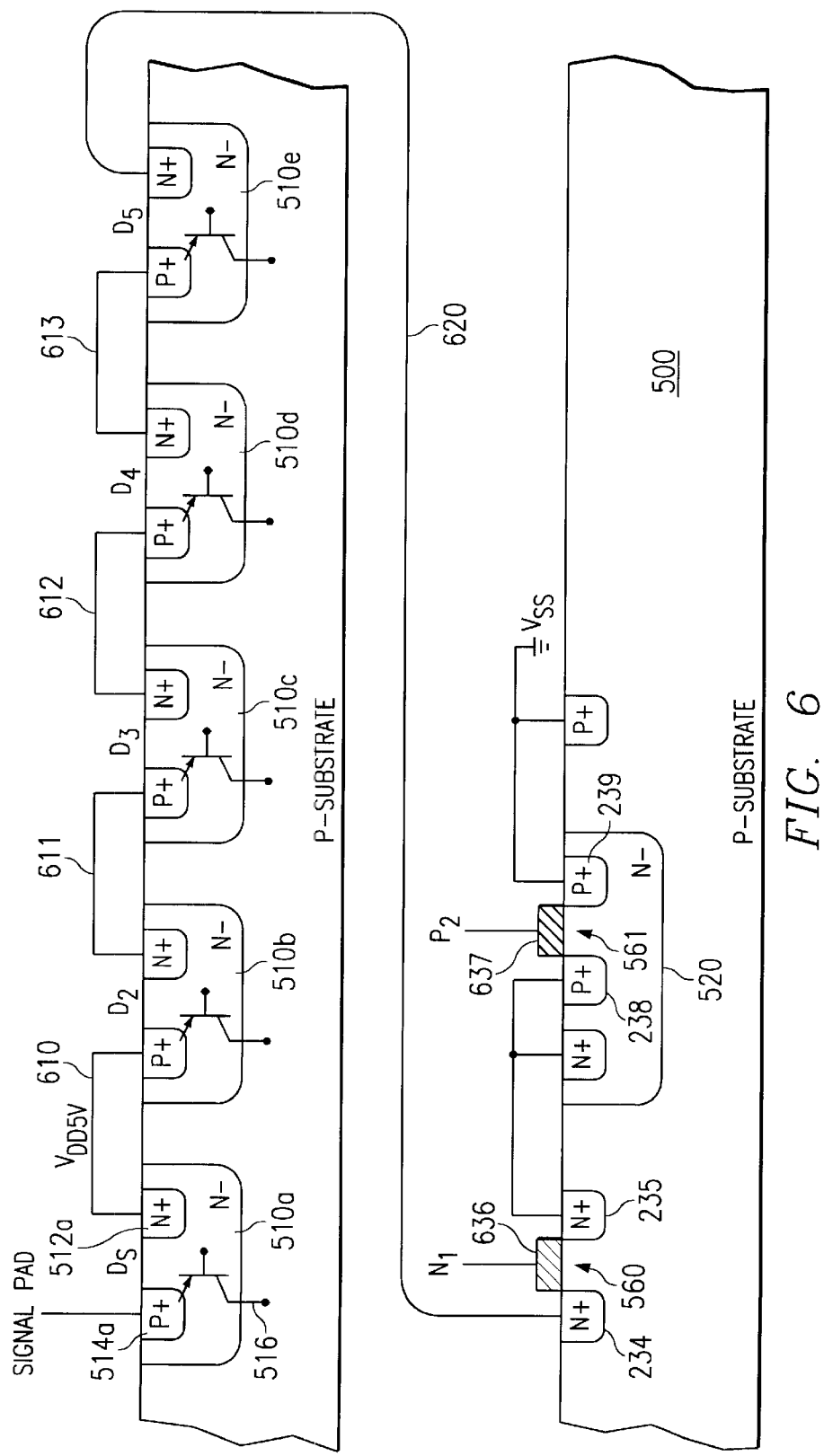
FIG. 6 shows cross sections of the devices illustrated in FIG. 5 with their parasitic lateral bipolar transistors.

FIG. 6 is a cross-sectional view of diodes DS and D2–D5 and transistors N1 and P2 illustrating parasitic lateral bipolar transistors associated with the diodes. Only a portion of p-type semiconductor substrate 500 is depicted. Remaining circuitry of integrated circuit 10 is formed on portions of semiconductor substrate 500 not shown. A parasitic transistor is associated with each diode due to the Nwells. P-type substrate 500 acts as a collector, while P+ region 514a is an emitter and Nwell 510a is a base, for example. As discussed earlier, the parasitic transistors associated with each of diodes D2–D5 conduct current into substrate 500 in response to an ESD event. Conductive member 610 is the $V_{DD-5V}$ bus and is connected to diode DS and to diode D2. Conductive members 611–613 connect diodes D2–D5 to form darlington 240. Signal trace 620 connects D5 to drain 234 of NMOS device N1.

As discussed with reference to FIG. 2, gate 636 of NMOS device N1 and gate 637 of PMOS device P2 and the gate of PMOS device P1, not shown, are biased during normal operation of integrated circuit 10 so that $V_{GS}$ and $V_{GD}$ does not exceed $V_{DD-3V}$. Advantageously therefore, gate oxide 560 and 561 and the gate oxide of P1 can be fabricated in the same production step to the same thickness as gate oxide used in the MOS devices of the other internal circuitry.

Figure 7:
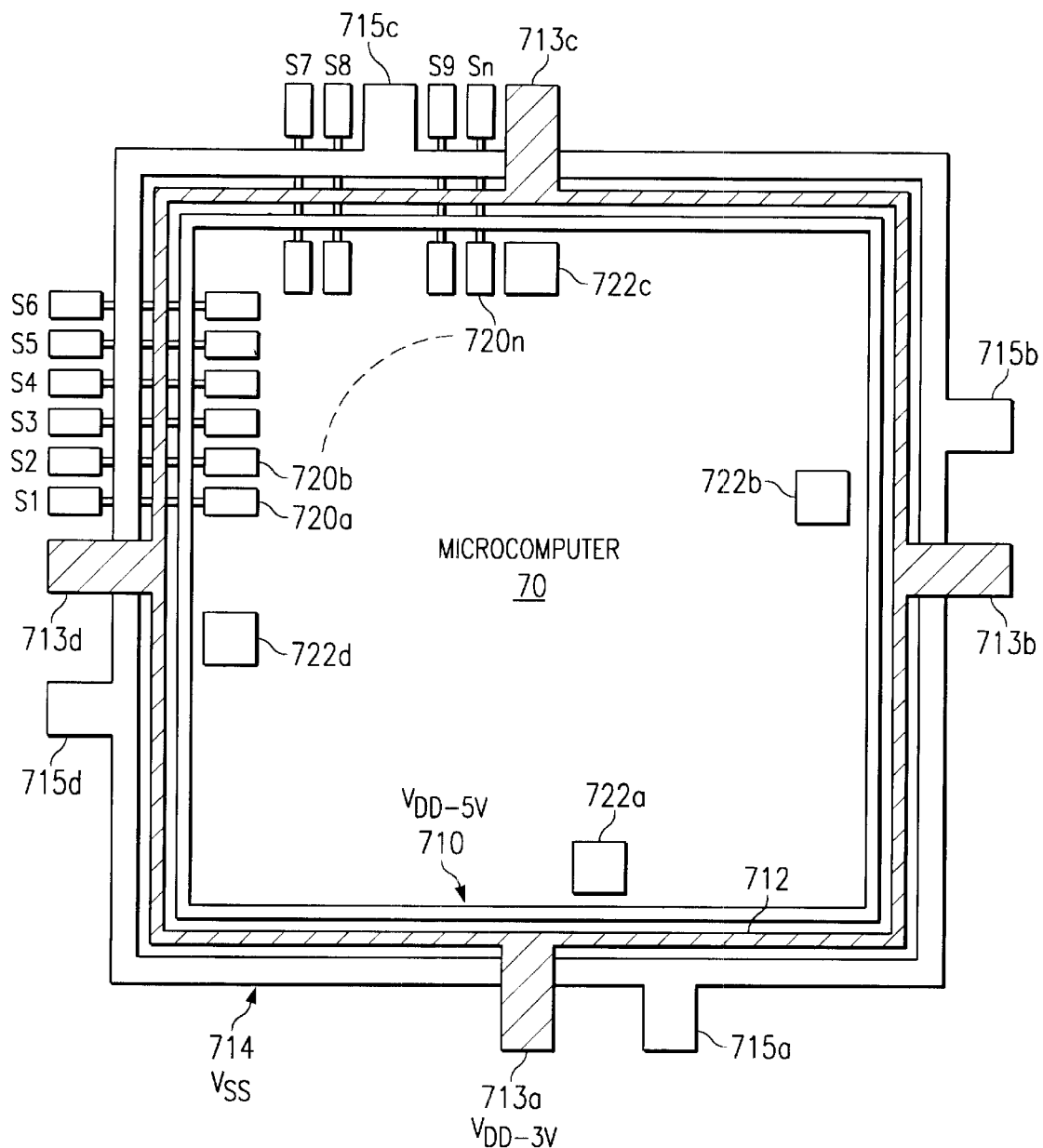
FIG. 7 is a floor plan of an integrated circuit which includes local ESD protection diodes and shared ESD clamp circuits, according to an aspect of the present invention.

FIG. 7 is a floor plan of integrated circuit 70, which in this embodiment is a microprocessor, which includes shared ESD clamp circuits 722a–722d, according to an aspect of the present invention. Signal pads S1–Sn are illustrated, but additional signal pads, not shown for clarity, are placed and connected similarly around the periphery of integrated circuit 70. Each clamp circuit 722a–722d is similar to clamp circuits 222 or 322. Each signal pad is connected to a respective ESD protection circuit 720a–720n. Each ESD protection circuit 720 is similar to ESD protection circuit 120a or 120b, for example. Each protection circuit 720 is connected to $V_{DD-5V}$ bus 710 by a diode and to $V_{SS}$ bus 714 by an explicit diode or an intrinsic diode, as described with respect to FIG. 2. Each clamp circuit 722 is connected (not shown in FIG. 7) to $V_{DD-5V}$ bus 710, $V_{DD-3V}$ bus 712, and $V_{SS}$ bus 714 as described with reference to FIGS. 2 and 3. Each clamp circuit 722a–d is located proximate to a $V_{DD-3V}$ bond pad 713a–d and to a $V_{SS}$ bond pad 715a–d. According to an aspect of the present invention, there are only a few clamp circuits 722, four for example, shared among many signal pad ESD protection circuits. An integrated circuit such as microprocessor 70 has several hundred signal pads with associated ESD protection circuits 720 that all share the few clamp circuits 722. Advantageously, each ESD protection circuit 720 is relatively small in area, while clamp circuits 722 which are relatively large in area are few in number.

In an alternative embodiment, clamp circuits 722 may be located away from voltage bond pads, such as in the corners of integrated circuit 70, for example.

Fabrication of integrated circuit 10 involves multiple steps of implanting various amounts of impurities into a semiconductor substrate and diffusing the impurities to selected depths within the substrate to form transistor devices. Masks are formed to control the placement of the impurities. Multiple layers of conductive material and insulative material are deposited and etched to interconnect the various devices. These steps are performed in a clean room environment.

A significant portion of the cost of producing the data processing device involves testing. While in wafer form, individual devices are biased to an operational state and probe tested for basic operational functionality. The wafer is then separated into individual dice which may be sold as bare die or packaged. After packaging, finished parts are biased into an operational state and tested for operational functionality.

Advantageously, an ESD protection circuit using a shared clamp circuit structure allows a smaller, lower signal pin capacitance, protection structure for same protection level as a non-shared ESD structure.

Advantageously, MOS devices in the shared clamp circuit are fabricated using the same thin oxide thickness as MOS devices used in the internal circuitry of the integrated circuit, even though the clamp circuit is exposed to operating voltage during normal operation of the integrated circuit that exceeds the safe operating range of the MOS devices.

As used herein, the terms "applied," "connected," and "connection" mean electrically connected, including where additional elements may be in the electrical connection path. The term "cascode device" or "cascode connected transistors" means a serial string of transistors connected in a source to drain fashion.

While the invention has been described with reference to illustrative embodiments, this description is not intended to be construed in a limiting sense. Various other embodiments of the invention will be apparent to persons skilled in the art upon reference to this description. For example, circuits with different values of $V_{DD}$ can be accommodated by including a different number of darlington connected diodes and/or a different number of cascoded MOS devices in the control circuit of the shared clamp circuits. The ESD transistors can have a different number of fingers than illustrated.

In another embodiment, the shared clamp circuits may be another type of ESD protection circuit using cascoded MOS devices for high voltage operation, such as an NMOS triggered NMOS circuit described in related U.S. patent application Ser. No. 09/325,527 (TI-27526) entitled "NMOS Triggered NMOS ESD Protection Circuit Using Low Voltage NMOS Transistors" and incorporated herein by reference, or a CMOS triggered NMOS circuit described in related U.S. Pat. No. 6,147,538 (TI-27528) entitled "CMOS Triggered NMOS ESD Protection Circuit" and incorporated herein by reference.

It is therefore contemplated that the appended claims will cover any such modifications of the embodiments as fall within the true scope and spirit of the invention.

What is claimed is:

1. A protection circuit, comprising:
   a first voltage supply terminal;
   a second voltage supply terminal;
   a first transistor having an emitter coupled to the first voltage supply terminal, having a collector coupled to the second voltage supply terminal, and having a base;
   a second transistor having an emitter coupled to the base of the first transistor, having a collector coupled to the second voltage supply terminal, and having a base; and
   a control circuit coupled between the first voltage supply terminal and the second voltage supply terminal, the control circuit having an output terminal coupled to the base of the second transistor, wherein the control circuit comprises:
   a third transistor arranged to produce current flow between the base of the second transistor and the output terminal; and
   a fourth transistor arranged to inhibit current flow between the base of the second transistor and the output terminal.

2. A protection circuit as in claim 1, comprising a plurality of transistors, each transistor having an emitter, a base, and a collector, wherein each collector is coupled to the second voltage supply terminal and wherein the base and emitter of each transistor is coupled in series with the plurality of transistors between the base of the first transistor and the emitter of the second transistor.

3. A protection circuit as in claim 1, comprising a third voltage supply terminal coupled to the control circuit, wherein the third transistor produces current flow between the base of the second transistor and the output terminal in response to a first voltage between the first voltage supply terminal and the third voltage supply terminal, and wherein the fourth transistor inhibits current flow between the base of the second transistor and the output terminal in response to a second voltage between the first voltage supply terminal and the third voltage supply terminal.

4. A protection circuit as in claim 3, wherein each of the first and second voltage supply terminals are external terminals and wherein the third voltage supply terminal is an internal voltage supply terminal.

5. A protection circuit as in claim 1, wherein the third transistor is an N-channel MOS transistor and wherein the fourth transistor is a P-channel MOS transistor.

6. A protection circuit as in claim 1, comprising a capacitor and a resistor coupled in series and having a common terminal between the first voltage supply terminal and the third voltage supply terminal, wherein each of the third transistor and the fourth transistor has a respective control gate coupled to the common terminal.

7. A protection circuit as in claim 1, comprising a fifth transistor coupled in series with the third and fourth transistors, the fifth transistor having a control gate coupled to the third voltage supply terminal.

8. A protection circuit as in claim 1, comprising:
  a first resistor coupled between the base of the first transistor and the first voltage supply terminal; and
  a second resistor coupled between the base of the second transistor and the first voltage supply terminal.

9. A protection circuit as in claim 1, comprising a plurality of local protection circuits, each local protection circuit including a bond pad and a local transistor coupled between the bond pad and one of the first and second voltage supply terminals.

10. A protection circuit as in claim 1, wherein each of the first and second transistors has a current gain and wherein a collector current of the first transistor is greater than a collector current of the second transistor by the current gain of the first transistor.

11. A method of protecting a circuit, comprising the steps of:
  receiving a first voltage between a first voltage supply terminal and a second voltage supply terminal;
  receiving a second voltage between a third voltage supply terminal and the second voltage supply terminal;
  detecting the first voltage by comparing the first voltage to the second voltage;
  activating a plurality of transistors connected between the first voltage supply terminal and the second voltage supply terminal in response to the step of detecting, the plurality of transistors having respective base and emitter terminals connected in series; and
  conducting current between the first voltage supply terminal and the second voltage supply terminal in response to the step of activating.

12. A method as in claim 11, comprising the step of latching a logic state in response to the step of comparing.

13. A method as in claim 11, wherein the step of activating comprises producing a respective base current in each transistor of the plurality of transistors.

14. A method as in claim 11, wherein the step of conducting comprises producing a respective collector current in each transistor of the plurality of transistors and wherein each said respective collector current differs from another collector current by a respective current gain.

15. A method as in claim 11, wherein the step of receiving a first voltage comprises receiving a local voltage from one of a plurality of local protection circuits coupled to the first voltage supply terminal.

* * * * *